United States Patent [19]

Bongianni

[11] 4,188,594
[45] Feb. 12, 1980

[54] FIXED FREQUENCY FILTERS USING EPITAXIAL FERRITE FILMS

[75] Inventor: Wayne L. Bongianni, Placentia, Calif.

[73] Assignee: Rockwell International Corporation, El Segundo, Calif.

[21] Appl. No.: 870,144

[22] Filed: Jan. 17, 1978

[51] Int. Cl.² .................. H03C 3/00; H03C 1/00; H01P 1/20; H01P 1/22
[52] U.S. Cl. .................... 332/16 R; 331/96; 332/51 W; 333/211; 333/81 B
[58] Field of Search .................. 333/17 L, 24.1, 24.2, 333/30 M, 73 W, 82 R, 81 B; 332/51 W, 52, 16 R

[56] References Cited

U.S. PATENT DOCUMENTS

| | | | |
|---|---|---|---|
| 2,948,870 | 8/1960 | Clogston | 333/24.2 UX |
| 3,100,288 | 8/1963 | Schloemann | 333/24.2 |

OTHER PUBLICATIONS

Soohoo, *Theory and Application of Ferrites*, Prentice-Hall, N.J., 1960, p. 256.
Lax et al., *Microwave Ferrites and Ferrimagnetics*, McGraw-Hill, N.Y., 1962, pp. 311, 312.

*Primary Examiner*—Paul L. Gensler
*Attorney, Agent, or Firm*—H. Fredrick Hamann; G. Donald Weber, Jr.; Gilbert H. Friedman

[57] ABSTRACT

Films of epitaxially deposited hexagonal ferrite material backed with metal and inserted into waveguides in single and multiple stages are used to form band-pass and band-stop filters, variable attenuators and modulators. The films have body resonance modes with resonant frequencies which are essentially fixed as an externally applied magnetic field is varied. Thin films of hexagonal ferrite material have resonant frequencies in the high microwave and millimeter wavelength frequency ranges. Since hexagonal ferrites have a high magnetic anisotropy and accompanying high internal magnetic field, little or no external magnetic bias may be required once the film is magnetized.

13 Claims, 5 Drawing Figures

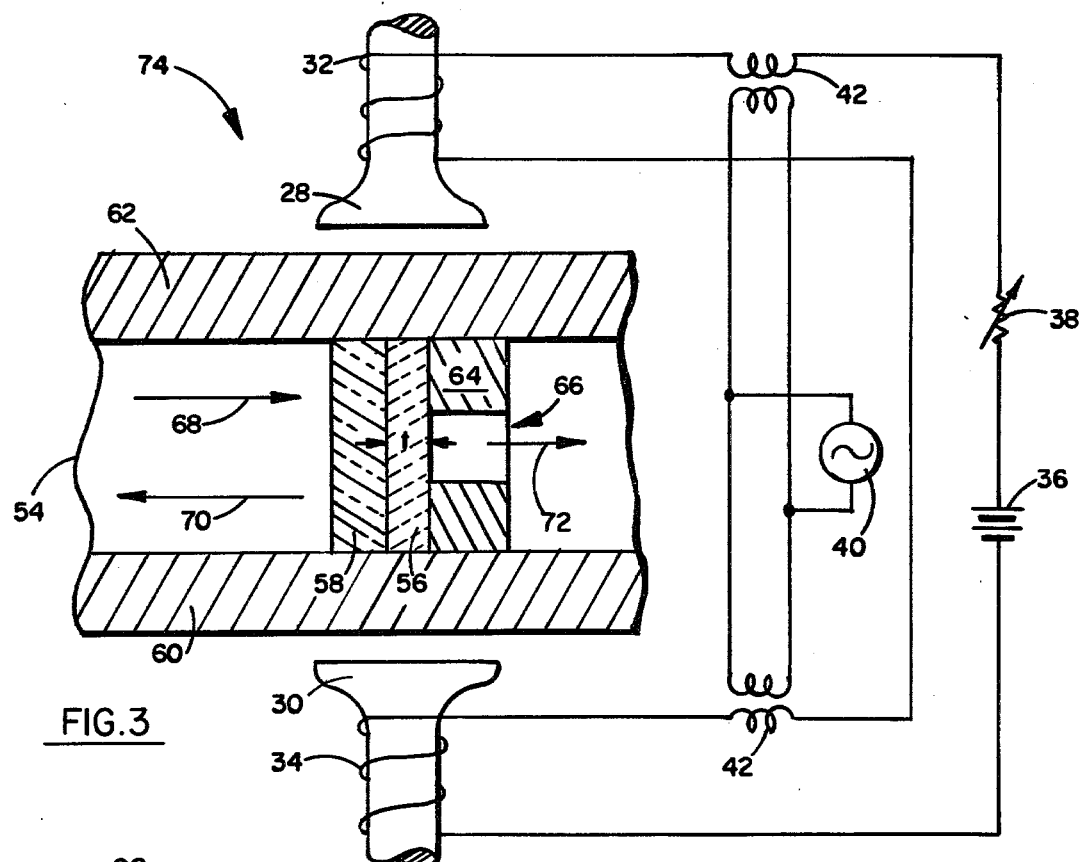
FIG.3
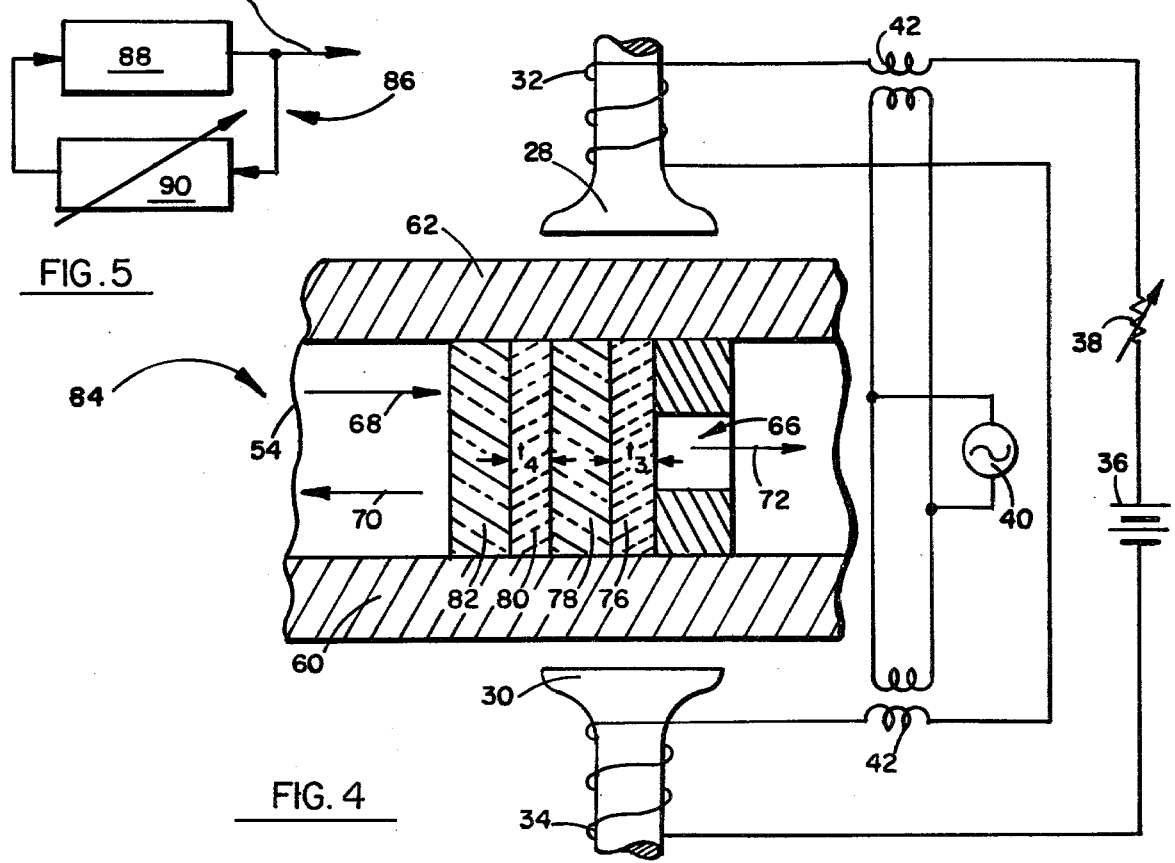
FIG.5
FIG.4

FIXED FREQUENCY FILTERS USING EPITAXIAL FERRITE FILMS

The invention described was made in the course of or under a contract or a subcontract thereunder with the Department of the Army.

BACKGROUND OF THE INVENTION

1. Field of the Invention

The present invention relates to electromagnetic wave filters employing thin film ferrite resonators and more particularly pertains to filters employing resonators having an essentially fixed resonant frequency.

2. Description of the Prior Art

At the lower microwave frequencies, cavity resonators compatible with conventional waveguides are well known for their fixed frequency operation. However, as the desired frequency of operation approaches the higher frequencies of the microwave band and still higher, the millimeter wavelength band, viz., from 24 to 300 GHz, cavity resonators are required to be very small. This small size makes the machining and fabrication of cavity resonators difficult and costly. These same considerations apply to the application of conventional waveguides to operation at the higher frequencies.

Microstrip and strip-line transmission lines and other components, including resonators, fabricated on dielectric substrates using photolithographic techniques have been used successfully at the higher microwave frequencies. However, these components tend to be relatively lossy. Therefore, resonators of this type have a relatively lower Q and, consequently, broader bandwidth then is frequently desired.

Ferrites have found broad application in microwave technology. Where a body of a ferrite material is employed as a resonator, the electromagnetic energy usually is coupled through the body by uniform spin precession about the magnetic field intensity vector in the ferrimagnetic material. The resonant frequency of such a resonator is the natural precession frequency of a magnetic dipole in the material subjected to a constant magnetic field. The natural precession frequency is a direct function of the intensity of the applied magnetic field, and of the magnetic anisotropy and saturation magnetization of the material.

Relatively high Q, narrow bandwidth resonators have been fabricated using spheres or slabs cut from single crystals of a ferrite such as, for example, yttrium iron garnet (YIG). Crystalline YIG has a cubic lattice structure. YIG resonators have been operated in their uniform spin precession resonance mode at the lower microwave frequencies. Establishing a resonance in this same mode at higher frequencies, however, requires higher applied magnetic field intensities than can be conveniently provided.

Although very high applied magnetic field intensities can be established with electromagnets having supercooled coils, the use of such electromagnets is not regarded as practical for most applications.

Resonators which depend upon the intensity of an applied magnetic field to establish their frequency of resonance, as do these prior-art resonators, suffer from an additional handicap. The resonant frequency will change or drift as the intensity of the applied magnetic field changes due to such factors as, for example, temperature variations.

Thin films of monocrystalline YIG have been deposited on single crystal substrates of gadolinium gallium garnet (GGG) and operated, in their uniform spin precession mode of resonance, as phase shifters or delay lines for magnetostatic surface waves. Examples of such surface wave devices are described in U.S. Pat. No. 3,864,647 issued Feb. 4, 1975, for "Substantially Linear Magnetic Dispersive Delay Line and Method of Operating It" granted to Bongianni, the inventor herein, and in U.S. Pat. No. 4,028,639 issued June 7, 1977, for "Oscillator Using Magnetostatic Surface Wave Delay Line," granted to Hagon et al. Such devices are subject to the same limitations as bulk YIG devices on higher frequency operation and drift due to temperature variations.

Some researchers in the field have long desired to use single crystal hexagonal ferrites in filters and related devices operating at the higher microwave frequencies and the even higher millimeter wavelength frequencies. One reason for this desire has been that single crystal material has relatively low loss. In addition, the hexagonal ferrites have a relatively very high magnetic anisotropy. Where the magnetic anisotropy is very high, the uniform spin precession mode of resonance may have a resonant frequency which is also very high. This is due to the direct dependence of this resonant frequency on magnetic anisotropy as mentioned above. Furthermore, since hexagonal ferrites such as, for example, $BaFe_{12}O_{19}$ are known to be permanent magnet materials, it is apparent that resonators formed from them, once magnetized, will require little or no externally applied bias magnetic field to magnetically saturate the material and establish a resonant frequency for a uniform spin precession mode of resonance.

However, resonators are not easily formed from bulk single crystals of the hexagonal ferrites. In addition to their high magnetic anisotropy, these materials have a very high structural anisotropy, or anisotropy of hardness, which results in their being relatively much softer structurally along certain planes than along others. This property makes the hexagonal ferrites extremely difficult to shape and machine.

The interest in hexagonal ferrites has focused, therefore, on obtaining high quality monocrystalline films of hexagonal ferrites epitaxially grown on nonmagnetic single crystal substrates of insulator, or dielectric, material. Some early work in this field is described in U.S. Pat. No. 3,486,937 granted to Linares, Dec. 30, 1969, for "Method of Growing a Single Crystal Film of a Ferrimagnetic Material" and in Stearns et al, Materials Research Bulletin, Vol. 10, pp. 1255-1258, 1975, Pergamon Press, Inc. Later work in this field is reported in Stearns et al, Materials Research Bulletin, Vol. 11, pp 1319-1326, 1976, Pergamon Press, Inc., "Liquid Phase Epitaxy of Hexagonal Ferrites and Spinel Ferrites on NonMagnetic Spinel Substrates" and in Glass et al, U.S. patent application Ser. No. 812,862 for "Epitaxial Growth of M-Type Hexagonal Ferrite Films on Spinel Substrates and Composite" filed July 5, 1977, and assigned to the assignee of the present application. The material in the latter two references describes the manner in which thin epitaxial films of hexagonal ferrite material were prepared for the use of the inventor herein in devices conforming to the subject invention as described hereinafter.

3. Disclosure

The following references are regarded as having pertinence to this invention.

(1) Bongianni "Advanced Epitaxial Ferrite Devices," Project No. IT 161102BH57-03, Final Report, U.S. Army Research Office, Contract #DAAG29-76-C-0017, Jan. 19, 1977.

(2) Lax & Button, "Microwave Ferrites and Ferrimagnetics," McGraw-Hill Book Co., Inc., New York, 1962.
(a) Sec. 7-3, "Metal-backed Slab," pp. 311–312.
(b) Sec. 12-10, "Nonreciprocal Field-displacement Devices," pp. 630–637.

(3) Baynham et al, U.S. Pat. No. 3,748,605, "Tunable Microwave Filters," July 24, 1973.

The contract report, written by the inventor herein, contains the first descriptions of any aspects of the present invention ever written and, starting on p. 8 thereof and in FIGS. 3, 4 and 6 thereof, presents data derived from measurements made on filters constructed in accordance with the present invention. This contract report is hereby incorporated by reference into this specification.

The first passage cited in the text by Lax & Button describes extra absorption peaks occurring in metal-backed insulating ferrite slabs. These extra absorption peaks, called "body resonances," are associated with multiple internal reflections which lead to standing waves within the slab. The condition for standing waves is given by the optical interference formula $t=(2n+1)\lambda/4$ where n is any integer including zero, t is the slab thickness, and $\lambda$ is the wavelength within the ferrite.

The second passage cited in the text by Lax & Button, on pp. 636 and 637 thereof, describes the use of the oriented-magnetoplumbite (hexagonal ferrite) permanent magnet material $BaFe_{12}O_{19}$ in a field displacement isolator operating at millimeter wavelength frequencies. Due to the very high magnetic anisotropy of the material, the isolator operates without need for an externally applied magnetic bias field.

The patent to Baynham et al, discloses a tunable, microwave frequency filter relying on the effects produced by multiple reflections of electromagnetic waves in magnetic layers sandwiched between waveguide irises, or other microwave discontinuities which are capable of producing large reflection coefficients for electromagnetic radiation.

SUMMARY OF THE INVENTION

This invention provides filters for operation at high microwave frequencies, millimeter wavelength frequencies, and into the far infra red frequencies, wherein resonators employed in the filters have an essentially fixed resonant frequency. The resonators are formed of thin monocrystalline films of hexagonal ferrite material epitaxially deposited on non-magnetic dielectric substrates. The resonant frequencies of such resonators remain essentially fixed despite the variation of an externally applied bias magnetic field.

It is believed that the fixed frequency resonance phenomenon observed is body resonance, as discussed above, wherein the thickness of the film determines the resonant frequency rather than uniform spin precession resonance which is dependent upon magnetic field intensity.

Various types of filters may be fabricated. These include band-pass and band-stop filters. A plurality of individual resonators having resonant frequencies selected to be staggered about a desired center frequency may be cascaded to form a single filter having a modified bandshape. By analogy to the lumped circuit component approach to cascading of tuned LC circuits, filters having relatively more desirable bandshapes such as those found in, for example, Butterworth or Chebyshev filters may be assembled.

In addition, filters of the type disclosed herein may be operated as variable attenuators and modulators.

BRIEF DESCRIPTION OF THE DRAWINGS

Like parts are given like reference numerals throughout the drawings. The figures have not been drawn to scale. Rather, the dimensions therein have been chosen primarily for the sake of illustration.

FIG. 3 is a cross-sectional view of a portion of a band-pass filter combined with a schematic representation of means for applying a magnetic bias.

FIG. 4 shows a band-pass filter similar to that shown in FIG. 3 but having a plurality of resonator stages.

FIG. 5 is a schematic diagram for a frequency modulator employing a filter in accordance with the invention.

DESCRIPTION OF THE PREFERRED EMBODIMENTS

Figure 1:
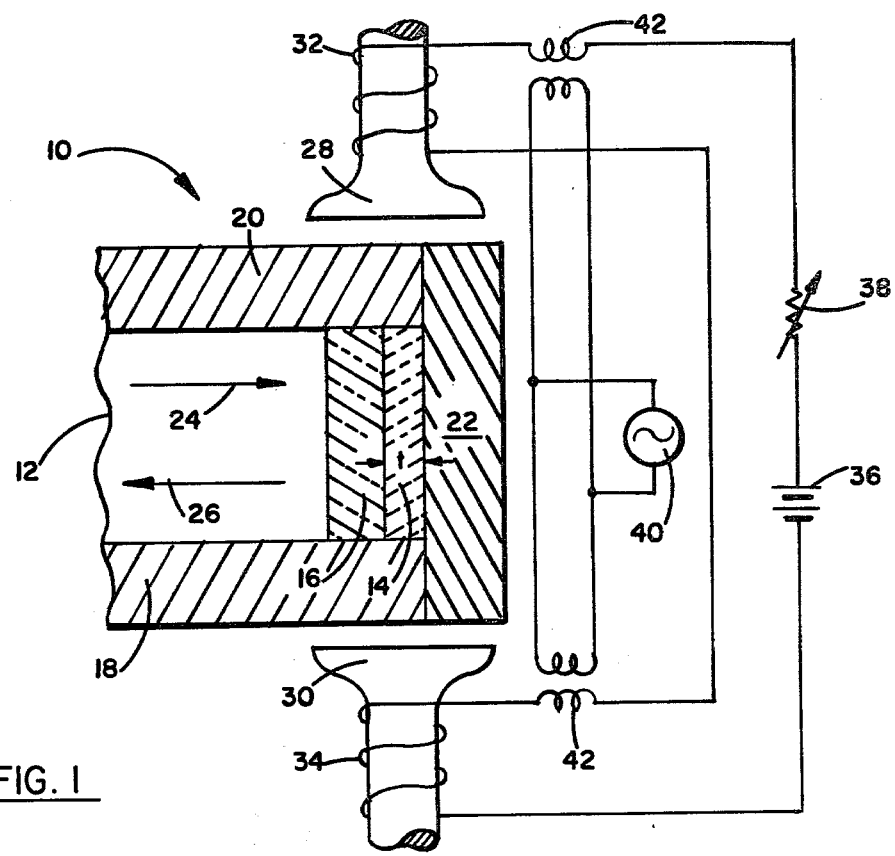
FIG. 1 is a cross-sectional view of a portion of a band-stop filter combined with a schematic representation of means for applying a magnetic bias.

FIG. 1 shows a single-stage band-stop filter 10 comprising a wave guide 12 and a thin film 14 of a monocrystalline hexagonal ferrite material disposed in the wave guide 12. The plane of the film 14 is normal to the direction of wave propagation.

The ferrite film 14 is epitaxially deposited on a single-crystal substrate 16 of a dielectric material having non-magnetic properties.

The substrate 16 may be formed from a single crystal of, for example, a non-magnetic spinel such as zinc gallate ($ZnGa_2O_4$). The natural facets of zinc gallate have a [111] crystallographic orientation. This is an appropriate orientation for the epitaxial growth on the facets of monocrystalline M-type hexagonal ferrite. M-type hexagonal ferrite has the prototype chemical formula $BaFe_{12}O_{19}$. A film of this ferrite so deposited on zinc gallate has its c-axis, the axis of easy magnetization, normal to the plane of the film.

The ferrite film 14 and substrate 16 may extend over the entire aperture of the wave guide 12. This is exemplified in FIG. 1 where the film 14 and substrate 16 are shown extending from the lower wave guide wall 18 to the upper wave guide wall 20. However, filters may be formed using the present invention wherein the ferrite film and substrate extend over less than the full aperture of a wave guide in which they are disposed.

Thin ferrite film 14 is shown in FIG. 1 as having a thickness t. The thickness t may be selected to be precisely one-quarter of a wavelength for an electromagnetic wave at a preselected frequency propagating in the hexagonal ferrite material. This selection is in accord with the optical interference formula fiven above and provides for a body resonance in the film 14 at the preselected frequency. Providing a film 14 having a selected thickness t may be accomplished by trimming a thicker film through the use of a suitable etching process, for example, chemical polishing or electron milling.

A particular ferrite film of the type described herein and having a thickness of about one mil was observed to resonate at a frequency of 56.4 GHz. Since the resonance observed appeared to be the fundamental body resonant mode, the wavelength of the electromagnetic wave propagating in the ferrite material was about four mils (about 100 microns) and the speed of propagation in the ferrite was thus about one-sixtieth (1/60) the free space speed of light. An inference may be drawn that a similar film deposited or polished to have a thickness of about 1 micron, which may be accomplished within the state of the art, would have a resonant frequency of about 1410 GHz. The latter frequency is in the range of the far infra-red.

As will be recognized by those skilled in the art, the absorption characteristic of the film 14 for frequencies above and below the resonant frequency will typically have the shape of a Gaussian curve representing the lesser extent that these higher and lower frequencies are also absorbed in the film 14. The bandwidth of the absorption characteristic increases as lossiness of the resonating film 14 increases, i.e., as Q or selectivity decreases. Typically, high Q and narrow bandwidth are preferred. The Q of a given film 14 will depend on its uniformity of thickness for body mode resonance. Thus, Q will be a function of the ratio of t to $\Delta t$, the rms surface roughness of the film 14. For example, a film with a surface roughness of about 50 angstroms rms would yield a Q of about 5000 for a one mil film.

It is apparent then that the same chemical polishing procedure used to trim the film 14 to obtain a thickness corresponding to a selected resonant frequency may also serve to increase the selectivity of the resulting resonator.

The ferrite film 14 is backed by a metal wall 22 in conductive contact with the metal structure of the wave guide 12. The metal wall 22 may be a plate, sheet, or film of any suitable high conductivity material such as, for example, gold, silver, copper, or aluminum. The metal wall 22 is a reflector for radiant energy. For example, the arrow 24 represents an incident electromagnetic wave propagating from left to right in the wave guide 12. The radiant energy which reaches the metal wall 22 is reflected back in the direction from which it came. Thus, there is present a reflected electromagnetic wave as represented by the arrow 26. However, where the film 14 possesses a resonant mode, energy in the incident electromagnetic wave at the frequency of the resonance is strongly absorbed in the film 14 and thus greatly attenuated in the reflected wave. That is what gives the configuration of FIG. 1 its characteristics as a band-stop filter. The filter 10 attenuates radiant energy in a band of frequencies centered on the resonant frequency of the film 14.

Having discussed reflection, it is apparent that the condition for standing waves, and thus body resonance, may be stated in a way which is an alternative to, but the equivalent of, the optical interference formula. A body resonance may occur in the film 14 for each frequency of wave propagation in the film for which there is a plane normal to the direction of propagation, in the film or on its surface, where an incident wave and a reflected wave are always out of phase by 180 degrees or an odd multiple of 180 degrees.

It is also apparent that the reflected or filtered wave will, in a typical application, be separated from the incident wave for further processing at a point removed from the filter by, for example, a directional coupler which is well known in the art.

FIG. 1 further shows means for externally applying a magnetic field parallel to the plane of the ferrite film 14. These means comprise the pole pieces 28 and 30, coils 32 and 34, and a voltage source 36 for energizing a direct current in coils 32 and 34. Such apparatus and variations thereof to produce an equivalent result are well known to those skilled in the art.

Tests were conducted in which a film of M-type hexagonal ferrite deposited on a substrate of zinc gallate was disposed in a waveguide in a configuration similar to the band-stop filter 10 shown in FIG. 1. The film is believed to have had a thickness t of between 10 and 20 microns. For each of several different fixed magnetic biases, a transmission measurement was made. The generated frequency of an rf source was swept and any loss from the energy transmitted was measured. The results of some of these tests are summarized in Table I.

TABLE I

| $H_o$ (KOe) | $f_r$ (GHz) | Loss (db) |
|---|---|---|
| 9 | 39.065 | 4 |
| 10 | 39.060 | 10 |
| 11 | 39.055 | 12 |
| 12 | 39.050 | 14 |

Table I shows four different settings for externally applied magnetic field intensity in kilo-oersteds, the resulting resonant frequency observed, $f_r$, in gigahertz, and the loss of absorption in decibels at the resonant frequency.

It may be observed by examination of Table I that the peak loss, or absorption of radiant energy at the resonant frequency, increases significantly as the applied magnetic field intensity is increased. It may also be observed that the resonant frequency itself changes slightly. The change in resonant frequency is believed to be the result of one or more second order effects such as, for example, magnetostriction causing changes in film thickness or changes in the speed of propagation due to changes in the effective permeability of the ferrite. The changes in resonant frequency are insignificant when compared with the approximately three gigahertz per kilo-oersted change in resonant frequency that would be expected if the mode of resonance was uniform spin precession.

The variation which occurs in peak absorption at the resonant frequency as magnetic field intensity varies, as shown in Table I, may be exploited to adapt the band-stop filter 10 to serve as, for example, a variable attenuator for millimeter wavelength signals. This adaptation is illustrated in FIG. 1 by the inclusion of a variable resistor 38 in the circuit supplying current to the magnet coils 32 and 34. As the intensity of the magnetic field externally applied parallel to the film 14 is varied by varying the variable resistor 38, radiation at or near the resonant frequency incident on the film 14 will experience varying amounts of attenuation as it is reflected.

By varying the magnetic field applied to the film 14 by pole pieces 28 and 30 at relatively higher frequencies, the bandstop filter 10 may be adapted to serve as an amplitude modulator. Such an adaptation is illustrated in FIG. 1 by the inclusion of an rf signal source 40 and transformer means 42 for coupling the signal output thereby to the magnet coils 32 and 34. The rf signal source 40 will cause radiant energy at or near the resonant frequency of the film 14 to vary in amplitude in correspondence with the signal output of the source 40 as the radiation is reflected from the film 14 due to the resultant variation of magnetic field intensity.

Figure 2:
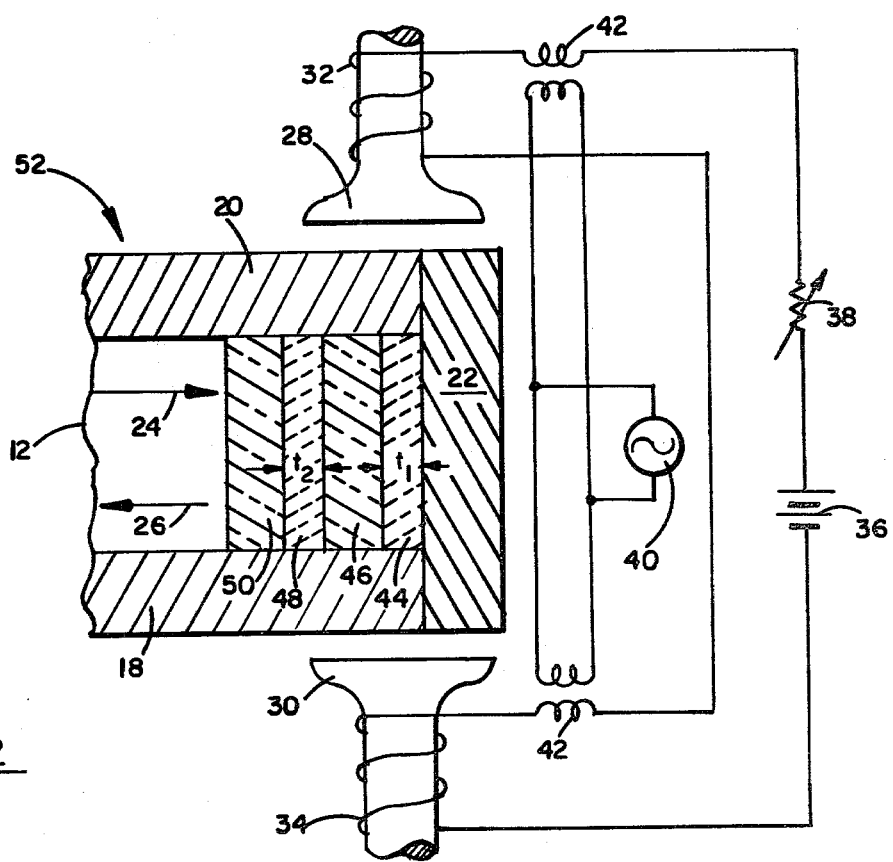
FIG. 2 shows a band-stop filter similar to that shown in FIG. 1 but having a plurality of resonator stages.

FIG. 2 shows a multi-stage band-stop filter 52. The filter 52 is similar to the band-stop filter 10 of FIG. 1 in most respects. However, the filter 52 has a plurality of stages or resonators. In this example, two such resonators are serially disposed in the wave guide 12. One resonator comprises a film 44 of hexagonal ferrite material epitaxially deposited on a single-crystal substrate 46 of dielectric material. The second resonator comprises a film 48 of hexagonal ferrite material epitaxially deposited on a single-crystal substrate 50 of dielectric material. The use of two ferrite films is by way of example only. In the practice of this invention, it is appropriate to use as many such ferrite films disposed to act in cascade as are desired.

In addition, it should be noted that the example given in FIG. 2 wherein the filter 52 has two films 44 and 48 each deposited on distinct substrates 46 and 50, respectively, is also by way of example only. The two films 44 and 48 can be deposited on the opposite sides of the same substrate 46, for example, thus reducing the number of substrates necessary for implementation of this invention. A procedure for accomplishing this result is given in Glass, U.S. Patent Application Ser. No. 831,033 for "Method of Fabricating Multiple Layer Composite," filed Sept. 6, 1977, and assigned to the assignee of the present application.

It is apparent that, in the band-stop filter 52, incident radiation propagating in the direction of the arrow 24 toward metal wall 22 is subject to absorption in two resonators, ferrite film 48 and ferrite film 44, before it is reflected back in the direction of the arrow 26. Each of the films 44 and 48 will absorb energy from the radiation in accordance with its own absorption characteristic. The resultant absorption will thus be cumulative.

The ferrite films 44 and 48 are shown in FIG. 2 as having thicknesses $t_1$ and $t_2$, respectively. Where these thicknesses are equal to each other, the body resonance modes of the films will have substantially the same resonant frequencies. The absorption characteristics of films 44 and 48, each of which will follow that of a Gaussian curve, will combine to form a cumulative characteristic which will also follow a Gaussian curve. However, as is also known, it is often desirable to implement filters wherein the cumulative absorption characteristic has a relatively broader bandwidth in the stop-band and steeper skirts outside the pass-band. By analogy to the well-known principles involved in the design of cascaded tuned LC circuits to provide flat-topped characteristics known as the Butterworth and Chebyshev responses, films 44 and 48 may be given thicknesses different from each other. The different thicknesses can provide for body mode resonant frequencies in the films 44 and 48 which are staggered above and below the desired center frequency for the filter by a predetermined increment. Thus, the bandshape of a band-stop filter which has a plurality of stages such as the filter 52 may be modified and improved over that of a single-stage filter.

Band-stop filter 52 is provided with means for externally applying a magnetic field to films 44 and 48 in the planes of the films and with means for modifying the externally applied field to cause the filter 52 to operate as a variable attenuator or as an amplitude modulator.

These aspects of the invention were discussed above in connection with the filter 10 of FIG. 1.

FIG. 3 shows a single-stage band-pass filter 74 comprising a wave guide 54 and a thin film 56 of a monocrystalline hexagonal ferrite material disposed in the wave guide 54. The plane of the film 56 is normal to the direction of wave propagation. The ferrite film 56 is epitaxially deposited on a single-crystal substrate 58 of a dielectric material.

All of the same considerations apply to the materials of the film 56 and the substrate 58 as were discussed above in connection with the film 14 and the substrate 16 of the filter 10 shown in FIG. 1.

The ferrite film 56 and substrate 58 may extend over the entire aperture of the wave guide 54. This is exemplified in FIG. 3 where the film 56 and substrate 58 are shown extending from the lower wave guide wall 60 to the upper wave guide wall 62. However, filters may be formed using the present invention wherein the ferrite film and substrate extend over less than the full aperture of a wave guide in which they are disposed.

Thin ferrite film 56 is shown in FIG. 3 as having a thickness t. The selection of a thickness t to provide for a preselected resonant frequency for body mode resonance in the film 56 is subject to the same considerations as were discussed above in connection with the film 14 of FIG. 1. These considerations include the applicability of the optical interference formula.

The ferrite film 56 is backed by a metal wall 64 in conductive contact with the metal structure of the wave guide 54. The metal wall 64 is an iris having an aperture 66 provided in its central portion. The aperture 66 allows some of the radiation which reaches the wall 64 to continue to propagate in the same direction. Otherwise, the metal wall 64 is similar to the metal wall 22 discussed above in connection with the filter 10 of FIG. 1. The size of the aperture 66 has no effect on the bandshape of the filter 74. However, the selection of aperture size does affect the attenuation of the filter 74.

More specifically, the arrow 68 in FIG. 3 represents the direction of propagation for incident radiation. Some of the incident radiation is reflected back in the direction from which it came as represented by the arrow 70. However, some fraction of the radiant energy incident on the ferrite film 56 will not be reflected by the metal wall 64 but will be coupled into the iris aperture 66 and transmitted forward in the direction represented by the arrow 72. When the film 56 possesses a resonant mode, energy in the incident electromagnetic wave at the frequency of the resonance is most strongly coupled into the iris aperture 66. Radiant energy at frequencies above and below the resonant frequency will be coupled into the iris aperture 66 to a lesser extent according to the typical Gaussian characteristic discussed previously. Thus, the filter 74 of FIG. 3 is a band-pass filter which transmits radiant energy in a band of frequencies centered on the resonant frequency of the film 56.

The operation of the filter 74 as a band-pass filter in the forward direction is consistent with its operation in the back or reflected direction as a band-stop filter in a manner similar to the filter 10 of FIG. 1. That is to say that where more radiant energy at a given frequency is selected by the filter 74 to be transmitted in the forward direction, it follows that less radiant energy at that frequency will appear in the reflected wave.

FIG. 3 further shows means for externally applying a magnetic field parallel to the plane of the ferrite film 56.

These means comprises the pole pieces 28 and 30, coils 32 and 34, and a voltage source 36 for energizing a direct current in coils 32 and 34. In addition, a variable resistor 38 is included in the circuit supplying current to the magnet coils 32 and 34. In a manner complementary to the situation discussed in connection with the band-stop filter 10 of FIG. 1, the band-pass filter 74 can also be made to operate as a variable attenuator. The filter 74 will respond to changes in the intensity of the externally applied magnetic field by changing the output level, or amplitude, of a given frequency of radiation within the pass band of the filter 74.

Similarly, by varying the magnetic field applied to the film 56 by pole pieces 28 and 30 at relatively higher frequencies, the band-pass filter 74 may be adapted to serve as an amplitude modulator in the same manner as was the band-stop filter 10 of FIG. 1. Such an adaptation is illustrated in FIG. 3 by the inclusion there of an rf signal source 40 and transformer means 42 for coupling the signal output thereby to the magnet coils 32 and 34.

FIG. 4 shows a multi-stage band-pass filter 84. The filter 84 is similar to the band-pass filter 74 of FIG. 3 in most respects. However, the filter 84 has a plurality of resonators and in this respect resembles the multi-stage band-stop filter 52 of FIG. 2. In the filter 84, two resonators are serially disposed in the wave guide 54. One resonator comprises a film 76 of hexagonal ferrite material epitaxially deposited on a single-crystal substrate 78 of dielectric material. The second resonator comprises a film 80 of hexagonal ferrite material epitaxially deposited on a single-crystal substrate 82 of dielectric material. Here again, the use of two ferrite films in the filter 84 is by way of example only. In the practice of this invention, it is appropriate to use as many such ferrite films disposed to act in cascade as are desired. In addition, it is appropriate to deposit the two films 76 and 80 on the opposite sides of, for example, the substrate 78, as discussed above in connection with the filter 52 of FIG. 2. This would make the use of the substrate 82 unnecessary.

It is apparent that, in the band-pass filter 84, the same considerations apply as were discussed in connection with the band-stop filter 52 of FIG. 2 with regard to obtaining a modified and improved bandshape for the filter characteristic. The film 76, having a thickness $t_3$, and the film 80, having a thickness $t_4$, may be fabricated so that the body mode resonant frequencies for films 76 and 80 are staggered above and below the desired center frequency for the filter. Butterworth and Chebyshev responses may be achieved or approximated in this manner.

As in the case of all of the filters previously discussed, the band-pass filter 84 is also provided with means for externally applying a magnetic field to the films 76 and 80, with means for varying the attenuation of the filter, and with means for causing it to function as an amplitude modulator.

FIG. 5 shows a schematic representation of an electronic circuit employing a filter in accordance with the subject invention wherein the circuit is a frequency modulator 86. As was mentioned above in connection with the discussion of Table I, a filter in accordance with this invention experiences a small second-order change in resonant frequency as an externally applied magnetic field is varied. These filters, being resonators, are frequency selective. FIG. 5 shows an amplifier 88 coupled to, for example, a band-pass filter 90 in a closed regenerative loop so as to form an oscillator which oscillates at the selected resonant frequency of the filter 90. The band-pass filter 90 may be similar to either band-pass filter 74 of FIG. 3 or band-pass filter 84 of FIG. 4. Band pass filter 90 includes means for varying the resonant frequency thereof, in the manner indicated by Table I, by, for example, an rf signal generator such as the rf signal generator 40 of FIG. 3. Given the configuration just described, the output signal appearing at the terminal 92 of frequency modulator 86 will be frequency modulated in correspondence with an rf signal supplied by the generator.

While the invention has been shown and described with reference to certain preferred embodiments thereof, it will be understood by those skilled in the art that various changes in details may be made therein without departing from the spirit and scope of the invention as set out in the following claims. For example, the use of substrates for the magnetic films might be omitted in appropriate cases.

Having thus described a preferred embodiment of the invention, what is claimed is:

1. A filter for electromagnetic waves comprising:
   a wave guide;
   a thin film of monocrystalline hexagonal ferrite disposed within said wave guide normal to the direction of propagation of radiant energy therein, wherein said thin ferrite film is epitaxially deposited on a single crystal substrate; and
   conductive means for reflecting radiant energy incident on and transmitted through said thin ferrite film back through said thin ferrite film.

2. A filter as recited in claim 1 comprising means external to said wave guide for applying a magnetic field to said thin ferrite film in the plane of said film.

3. A filter as recited in claim 1 wherein a plurality of said thin ferrite films are serially disposed within said wave guide normal to the direction of propagation of radiant energy therein.

4. A filter as recited in claim 3 wherein each of said plurality of thin ferrite films has a thickness preselected to provide said ferrite film with a body resonance mode at a predetermined frequency of resonance.

5. A filter as recited in claim 3 wherein said plurality of thin ferrite films are epitaxially deposited on the opposite sides of an individual single-crystal substrate.

6. A filter as recited in claim 5 wherein each one of said thin ferrite films has a different thickness.

7. A filter for electromagnetic waves, comprising:
   a wave guide;
   a thin film of a monocrystalline hexagonal ferrite disposed within said wave guide normal to the direction of propagation of radiant energy therein;
   conductive means for reflecting radiant energy incident on and transmitted through said thin ferrite film back through said thin ferrite film; and
   means external to said wave guide for applying a magnetic field to said thin ferrite film in the plane of said film.

8. A filter as recited in claim 7 wherein said thin ferrite film has a thickness selected to provide said film with a body resonance mode wherein multiple reflections of said radiant energy at a predetermined frequency of resonance occur within said film and wherein said thickness and said predetermined frequency are related to each other by the optical interference formula $$t = (2n+1)(\lambda/4)$$

where n is any integer including zero, t is said thickness, and λ is the wavelength of radiant energy propagating within said ferrite at said predetermined frequency.

9. A filter as recited in claim 8 wherein a portion of radiant energy originally transmitted through said wave guide and incident on said thin ferrite film is reflected back through said wave guide and wherein radiant energy at said frequency of resonance is reflected back through said wave guide to a lesser extent than radiant energy at other frequencies whereby said filter operates as a band-stop filter.

10. A filter as recited in claim 9 wherein said conductive means for reflecting energy is an iris having an aperture therein for transmitting radiant energy through said conductive means and wherein radiant energy at said frequency of resonance is transmitted through said conductive means to a greater extent than radiant energy at other frequencies whereby said filter operates as a band-pass filter.

11. A filter as recited in claim 10 comprising means for varying the intensity of said magnetic field and thereby varying the extent to which radiant energy at said frequency of resonance is absorbed in said thin ferrite film whereby said filter is caused to operate as a variable attenuator.

12. A filter as recited in claim 11 wherein said means for varying the intensity of said magnetic field includes rf signal generator means for varying the extent to which energy at said frequency of resonance is absorbed in said thin ferrite film at a rate conforming to a signal produced by said rf signal generator whereby said filter is caused to operate as an amplitude modulator.

13. A filter as recited in claim 12 wherein said wave guide is coupled to regenerative circuit means for producing an electrical oscillation at said frequency of resonance and wherein said frequency of resonance is caused to vary at a rate conforming to said signal produced by said rf signal generator whereby said regenerative circuit is caused to operate as a frequency modulator.

* * * * *